United States Patent
Purser et al.

(10) Patent No.: US 7,439,526 B2
(45) Date of Patent: Oct. 21, 2008

(54) BEAM NEUTRALIZATION IN LOW-ENERGY HIGH-CURRENT RIBBON-BEAM IMPLANTERS

(75) Inventors: Kenneth H. Purser, Lexington, MA (US); Norman L. Turner, Vero Beach, FL (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 249 days.

(21) Appl. No.: 11/312,055

(22) Filed: Dec. 20, 2005

(65) Prior Publication Data

US 2006/0197037 A1   Sep. 7, 2006

Related U.S. Application Data

(60) Provisional application No. 60/645,458, filed on Jan. 19, 2005, provisional application No. 60/642,612, filed on Jan. 10, 2005, provisional application No. 60/638,848, filed on Dec. 23, 2004, provisional application No. 60/637,625, filed on Dec. 20, 2004.

(51) Int. Cl.
*H01J 37/317* (2006.01)
(52) U.S. Cl. ................. 250/492.21; 250/251; 313/359.1
(58) Field of Classification Search ............. 250/492.21
See application file for complete search history.

(56) References Cited

U.S. PATENT DOCUMENTS

| | | | | |
|---|---|---|---|---|
| 5,750,987 | A | * | 5/1998 | Ichimura et al. ............. 250/251 |
| 6,515,408 | B1 | * | 2/2003 | England et al. ........... 313/359.1 |
| 6,762,423 | B2 | | 7/2004 | Liebert et al. ........... 250/492.21 |
| 6,891,174 | B2 | * | 5/2005 | Wenzel et al. .......... 250/492.21 |

* cited by examiner

*Primary Examiner*—David A. Vanore
*Assistant Examiner*—Phillip A. Johnston
(74) *Attorney, Agent, or Firm*—Nields & Lemack (57) ABSTRACT

The fabrication of modern semiconducting integrated circuits often requires implantation steps that involve high currents of low-energy charged dopant atoms. When employing such beams, the addition of electrons or negative ions for neutralizing the effects of space charge is often crucial for achieving success. Without this supplement, ion beams can 'blow-up' causing loss of intensity and disruption of beam focusing. In the present disclosure, methods are presented for introducing and constraining neutralizing low-energy electrons and negative ions within the boundaries of ribbon beams within regions of magnetic field deflection. Apparatus is described for maintaining neutralization based upon a reduction of electron losses, plasma bridge connections and secondary electron production. As part of plasma introduction to the deflection region a novel cryogenic pumping apparatus selectively removes neutral atoms from a plasma stream.

42 Claims, 10 Drawing Sheets

BEAM NEUTRALIZATION IN LOW-ENERGY HIGH-CURRENT RIBBON-BEAM IMPLANTERS

This Application claims priority to U.S. provisional patent application Ser. Nos. 60/637,625 filed Dec. 20, 2004 entitled "Improving Beam Neutralization in Low-Energy High-Current Implanters"; 60/638,848 filed Dec. 23, 2004 also entitled "Improving Beam Neutralization in Low-Energy High-Current Implanters"; 60/642,612 filed Jan. 10, 2005 also entitled "Improving Beam Neutralization in Low-Energy High-Current Implanters"; and 60/645,458 filed Jan. 19, 2005 also entitled "Improving Beam Neutralization in Low-Energy High-Current Implanters", the disclosures of which are incorporated herein by reference in their entirety.

FIELD OF INVENTION

This invention relates to methods and apparatus used for low-energy high-current ion implantation using ribbon beams. Specifically, the invention improves the efficiency of space-charge neutralization using electrons or negative ions for minimizing the effects of space-charge disruption.

BACKGROUND OF THE INVENTION

Implantation, one of the great success stories of the $20^{th}$ century, has become a key technology employed during the production of miniature transistors and integrated circuit arrays—(IC's). Implantation has made miniaturized IC technology practical by allowing the controlled introduction of precise concentrations of many species of charged dopant atoms and molecules, including boron, $BF_2$, arsenic, phosphorus, indium and antimony. These dopants change the characteristics, and in particular the conductivity, of underlying semiconducting materials. Circuit patterning using implantation can be achieved with great precision and at any chosen depth beneath the semiconductor surface making possible the fabrication of complex two dimensional and three dimensional circuits.

To predict where this technology will move in the future it is useful to look at the record of the past quarter century. It can be seen that silicon technology has constantly progressed towards smaller and smaller sizes of channel lengths and gate oxide thicknesses and that Moore's observation—often referred to as 'Moore's Law'—indicates that for several decades the doubling time for IC transistor density has been between 12 and 18 months. This trend is anticipated to continue for at least another 10 years with the driving force being the production of smaller, higher-speed devices. To achieve such improvements the size of both the lateral and depth dimensions of IC's must be reduced and general development of 3-dimensional circuitry may become essential. This has lead IC designers to propel ion implantation technology towards higher dopant currents, lower implantation energies and improved angle of incidence control at the work piece. Angle control is essential for minimizing channeling effects and the proper execution of angled implants. Summarizing, the future of this technology looks rosy and it is anticipated that implantation will be with us for a long time.

The depth within a semiconducting crystal where implanted dopant atoms come to rest is set by the energy of the incoming dopant ions. Thus, flexibility in the choice of implant energy is an essential feature of a successful implantation tool. Often, IC manufacturers require dopant energies ranging anywhere between ~250 eV and 3000 keV; a ratio of over 10,000. Dopant beam current is another important parameter: useful dopant currents can be as small as 1 microampere but can exceed 30 milliamperes for other applications.

At higher current levels repulsive space-charge forces between dopant ions come into play. The resulting disruptive effects on ribbon-beam shape are particularly troublesome when ion energies are low and when the charged dopant atoms pass through deflecting magnetic fields. The resulting beam expansion can cause unacceptable losses of ions to the walls and the impairment of the ion focusing needed for proper operation. However, nature is kind: counterbalancing space-charge forces is possible by the introduction of electrons and negative ions to the beam; also by the use of adjustable auxiliary focusing elements that compensate for imperfect neutralization.

Without limitation, a special class of implanter, generally referred to as 'high-current tools', is the central theme of the present patent disclosure. This class is defined to be those machines whose ion intensities are sufficiently great that beam neutralization is essential for proper operation; electrons or negative ions must be added to the accelerated beams for space-charge neutralization and proper operation.

The characteristics of most high-current implanters include: (i) short optical path lengths; (ii) cross-sectional beam dimensions tend to be large; (iii) low-energy electrons are introduced for space-charge neutralization; (iv) conservation of neutralizing electrons already trapped within the dopant beam; (iv) active focusing for the compensation of residual disruptive forces and high energy electron truncation of the Maxwellian electron distribution.

An improvement for high current implanters has been the introduction of ribbon-beam technology. Here, ions arriving at a work piece are organized into a stripe that coats the work piece uniformly as the wafer is passed under the ion beam. For single-wafer implanters the wafer need only travel along a single dimension under the incoming ribbon beam, greatly simplifying the mechanical design of end-stations and eliminating the need for transverse electromagnetic scanning: using a correctly shaped ribbon beam, uniform dosing density is possible across a work piece with a single one-dimensional pass of the wafer. An important feature is that throughput can be high and is not limited by the wafer scanning capability of end stations that employ two dimensional mechanical scanning. In principle, the ribbon-beam concept is not limited to a maximum wafer size and 450 mm wafers can be passed through the system at the same rate as 200 mm or 300 mm wafers. However, it should be emphasized that D.C. ribbon beam technology has special problems of its own particularly during the production of low-energy ion beams: These include the difficulty of space charge neutralization of beams having large transverse dimension.

To demonstrate the effects of space charge on low energy beams it is useful to consider a directed ion beam having a current density, J. Such a beam will produce a specific dose/unit area in a constant time independent of energy. Using simple geometry, it can be seen that such a constant-current beam has an electric charge per unit volume that is inversely proportional to the velocity of the beam ions. Thus, Q, the beam charge density, is inversely proportional to the square root of the ion energy:

$$Q = J/(2\,eU/M)^{1/2} \qquad (1)$$

Here e is the electronic charge, U is the ion energy and M is the ion mass.

Within the ion beam a radial acceleration is produced as a consequence of the electric fields generated by the space-charge density, Q. These fields grow inversely with the square root of the energy but fall as the beam current density is reduced; suggesting that broad beams are best. Because of beam symmetry there is no electric field at the beam center and disruptive forces from space charge increase with the distance from the center. A further calculation, based upon simple Newtonian mechanics, demonstrates that the physical beam expansion, seen in the laboratory, is proportional to $1/U^{3/2}$; a powerful law.

In practice, the effects of space charge begin to become noticeable at energies below about 15 keV. Thus, when efforts are made to design an implanter that will operate at both high and low energies (say 15 keV and 250 eV) the problem is greatly complicated by the effects of space charge.

Additional contributions to beam-width expansion can occur if deceleration is used for producing the low-energy ions: The inevitable phase-space expansion that occurs as the ions are slowed further aggravates ion losses to the walls with the overall effect being that the outside dimension of the beam may actually increase proportionately to $1/U^2$, or even faster.

At higher energies and in zero field regions (drift spaces), a common technique for compensating the unwanted effects of space charge is to flood the region with low-energy electrons produced by interactions between fast beam ions and the residual molecules and atoms present in the vacuum system. These electrons are produced within the beam itself using the reaction described below and labeled (2). Because electrons are actually produced within the beam itself they can become trapped within the ion-beam boundaries. In practice, this mechanism allows space-charge equilibrium to be established between the introduction of neutralizing electrons to the beam envelope and the loss of high-energy Maxwellian electrons that escape from the beam's electrostatic potential well.

It should be underscored that the degree of neutralization obtainable depends upon the level of random noise within the ion beam. A momentary reduction in ion output can cause a rapid loss of neutralizing electrons which may take ~30 microseconds to rebuild.

In severe cases the beam may become unstable or 'hashy'. However, if the source is 'quiet'—producing beams with low noise—and if an adequate flux of secondary electrons is available, the fractional neutralization can be 99% or even higher; it should be noted that even the residual 1% can induce significant beam divergence at very low energies and compensating auxiliary focusing may be needed to avoid beam losses.

Two atomic reactions are of importance for generating neutralizing electrons:
(i) Ionizing Collisions: At higher energies the most important reaction for generating electrons involves interaction within the vacuum environment between a high-speed beam ion, $I^+$, and a residual molecule or atom, $R^0$, producing a charged residual gas molecule, $R^+$, plus a free electron:

$$I^+ + R^0 > I^+ + R^+ + \text{electron} \qquad (2)$$

The energy needed to rupture the electron binding of $R_0$ comes from the beam itself making possible the generation of low-energy electrons within the potential well of the beam, where the probability of escape can be small. The cross section for this type of reaction induced by boron ions at an energy of 5 kev is about $10^{-16}$ cm$^2$, but this cross-section falls dramatically as the energy of the ions is reduced towards zero. The introduced electrons orbit around and through the beam in a variety of trajectories that involve collisions that can cause energy transfer and thermalization. The electron energy distribution quickly becomes Maxwellian with those electrons in the distribution having an energy greater than the depth of the beam well escaping.

For beam energies below a few keV this ionization process becomes progressively less useful as cross sections for producing electrons falls towards zero at the same time that the space charge forces are growing.

(ii) Charge Exchange Collisions: A second electron production process involves high-speed beam ions, $I^+$, that pick up an electron from residual gas molecules or atoms, $R^0$, by exchanging charge but producing no free electrons:

$$I^+ + R^0 > I^0 + R^+$$

Thus, in addition to the slow charged ions, R+, that are formed there is a population of fast neutrals, $I^0$, which more or less continues along the same direction as their fast parent ion. The cross sections for these type (ii) collisions are much higher than that for type (i) and remain high to the lowest energies that have been measured.

However, as mentioned type (ii) reactions do not generate electrons within the beam, as does type (i), and secondary electrons are only produced where the fast neutrals, $I^0$, strike the walls or magnet poles where they produce secondary electrons that can then be captured by the ion beam. The slow residual positive ions, R+, formed within the beam, are repelled and these, too, produce secondary electrons when they strike the walls. However, capture by the beam is dependant upon the geometry and neither of the above type (i) or (ii) processes provide a reliable method for generating neutralizing electrons at low energies where the necessary neutralization density must grow to match the charge density, Q, shown in expression (1).

Neutralization in Magnetic Fields

When ion beams pass through magnetic fields neutralization becomes even more difficult at low energies. Not only do the cross sections for type I reactions [equation (2)] become small but any neutralizing electrons that do become available are constrained to follow the magnetic field lines where they demonstrate high mobility along the magnetic field direction but close to zero mobility at right angles. A consequence is that it is impractical to neutralize space charge within a magnetic field by introducing low energy electrons from nearby drift regions.

J. G. England et al. in U.S. Pat. No. 6,515,408 and R. B. Liebert et al. in U.S. Pat. No. 6,762,423 describe methods and apparatus for providing electrons for space-charge neutralization within magnetic fields. In both disclosures neutralizing electrons are produced from filament sources distributed over the surfaces of the magnetic poles. Electrons produced at the surface of the magnet poles electrons have ready access to magnetic field lines causing easy passage into the beam region. In the case of U.S. Pat. No. 6,515,408 additional electron-emitting filaments are distributed over the poles in both arctuate and radial patterns, electrostatic repulsion shields are included behind the filaments to reflect electrons away from the walls and carbon filaments are used for electron production minimizing contamination from refractory metals. For some beams energies as high as 70 eV have been used—substantially greater than the depths of most partially-neutralized space-charge wells.

An important issue for the methods presented in both patents 423 and 408 is that neutralization electrons enter the beam space charge well with energy above the local zero potential. Consequently, trapping is difficult to achieve as even zero-energy electrons generated far away will tend to be accelerated through the beam and out the other side and not be trapped. Only inelastic or elastic electron/electron collisions within the beam can cause such electrons to become trapped.

Present Disclosure

In the present disclosure neutralization is achieved within a magnetic field using plasma consisting of charged argon, xenon or krypton ions as a low impedance conduction path between local ground potential and the potential well of the ion beam. Two embodiments for achieving this transport are described. The first involves a field-free region beneath the pole of the magnetic deflector. The second involves the introduction of electrons from a field free region.

With plasma introduction the electron paths are constrained by the magnetic field and drift away from the pole with the slow and heavy positive particles, which are not as affected by the magnetic fields, trailing along. On reaching the beam boundary the plasma electrons change their allegiance and become trapped within the beam retaining their original kinetic energy. The abandoned positive ions from the plasma are repulsed by the beam potential and accelerate towards the magnetic poles where they produce further secondary electrons that will, in turn, be attracted towards the ion beam and return along magnetic field lines. Between the poles and the beam boundary a plasma connection is established that allows large electron currents to be transported to the beam region.

In addition techniques will be described that use secondary electrons to provide the needed neutralization. Generally, these involve higher-energy sources of electrons that bombard a target such as carbon or silicon to produce low-energy secondary electrons that are introduced to the beam from regions below the magnetic poles.

In the present disclosure methods and apparatus will be presented for achieving the six steps necessary for the satisfactory injection of electrons into high-intensity low-energy ion beams. These include: 1 Appropriate sources of plasma for producing a low-impedance connecting path between local ground and the ion beam. 2 A source of supplementary electrons that overcomes the plasma-source limitations that the ion current must be equal to the electron current. 3 Transport of electrons to the ion beam potential well 4 Trapping of electrons within the ion beam potential well 5 Distribution of electrons to other parts of ion beam 6 Conservation of trapped electrons.

Plasma Generator

While those skilled in the art will recognize that a variety of plasma generator designs may be chosen, in the preferred embodiment the geometry of a Helicon discharge has been chosen as the plasma generator of choice. The details of this type of discharge has been discussed by F. F. Chen on pages 1-75 in the book edited by Oleg A. Popov and published by Noyes Publications, entitled 'High Density Plasma Sources'. The characteristics that make the Helicon geometry appealing are low-pressure operation, high ion-pair densities, useful plasma injection into confining channels, no internal electrodes within the discharge tube and controllable electron-energy distribution.

A second embodiment described uses a hollow cathode source as a substitute for the Helicon variety mentioned above. The virtues of Hollow Cathode devices are that they are smaller in diameter making possible the location of the plasma source close to the point of use. Also that they can be a prolific source of electrons.

A serious issue that must be addressed when using plasma transport for introducing neutralizing electrons is disposing of the unwanted gas: an inherent part of the plasma generation process. Very high pumping speeds are needed and in conventional pumping geometries the use of turbine pumps or cryogenic pumps are usually conductance limited by the vacuum impedance of the plumbing that couples the pump to the chamber.

A novel methods using cryogenic cooling is described that can be applied to provide very high speed collection of gasses such as Argon, Krypton or Xenon introduced to the plasma generator.

Production of Supplementary Electrons.

In a sealed plasma source such as the Helicon without internal filaments the electron production is equal to the ion production rate. The extraction rate is limited by the area of the exit aperture and the slow speed of the ions. However, after the bridging connection to the ion beam has been established higher electrons currents can be transmitted between local ground and the ion beam, in a manner analogous to the operation of a copper wire. Those skilled in the art will recognize that a variety of supplementary sources might be employed to augment the electron current flow including directly heated tungsten or molybdenum filaments, indirectly heated cathodes or heated $LaB_6$.

Transport of Plasma and Electrons

Minimal transverse magnetic field is desirable within the plasma transport region as electrons travel along the field lines. If there is a significant transverse component electrons will be lost at the walls of the transport region. To satisfy this requirement argon or other suitable plasma is directed through a hole that penetrates the underside of the steel pole of the deflecting magnetic dipole. The interior of such a hole is a low magnetic field region even though the beam-deflecting dipole magnetic flux, $\underline{B}_0$, may be quite large. This flux passes around the hole through the steel with the magnetic field tending to avoid crossing the opening created by the hole and passing around it through the surrounding high-permeability steel. Within the hole the residual flux, $\underline{B}_0/\mu$, will be close to zero. Here, $B_0$ is close to the intensity of flux required to deflect the ion beam and $\mu$ is the steel's relative permeability—typically ~2000. Those skilled in the art will recognize that by the inclusion of a further Mumetal shielding the field can be reduced to almost zero. Such a non-magnetic region provides a channel through which neutralized plasma can be directed without interference from transverse magnetic-fields, particularly if a solenoidal field is established along the hole through the steel. It also provides a region where small-diameter hollow-cathode sources can be operated without interference from transverse magnetic fields. To ensure concentration along the axis of the hole a solenoidal magnetic field can be introduced by incorporating a closely wound current-carrying spiral along the inside of the tube.

Distribution Through the Beam

One important issue that is addresses in the present disclosure is a method for moving the electrons through the volume of the ion beam and not allow them to be concentrated near the spot where they are introduced. This necessary motion is achieved by using E×B electron drift around the edges of the magnetic region coupled with B×grad B and curvature drifts. The details of these processes are discussed on pages 23-30 in the book entitled "Plasma Physics and Controlled Fusion" written by F. F. Chen, published by Plenum Press in 1983.

Conservation of Electrons

After the neutralizing electrons have been moved into place it is important that they do not escape easily. Avoiding the loss of neutralizing electrons is critical. In part this criticality arises from instabilities in the ion source. If there is no way to prevent the immediate loss of neutralizing electrons any reduction in ion source output intensity will immediately lose space-charge neutralization. In practice losses occur quickly but reestablishment of neutralization takes a longer time; it has been reported that the recovery time is typically of magnitude 30 microseconds.

Conservation of Electrons:

The formation of local concentration points on the poles of the deflecting magnets where the magnetic flux tends to concentrate using configurations of permanent magnets embedded in the magnetic poles to produce strong electron reflection. The effect produces a local flux concentration and electron trapping similar to electron trajectories in the Aurora Borealis.

Further Embodiments

A further embodiment for providing neutralizing electrons based upon the direct use of electrons is also described. Electrons can be generated by field emitters that are fabricated in the form of a large-area field-emission cathode located on one pole of the deflecting magnet and located under the ion beam. However, unlike the sealed cathodes used in plasma-display television tubes the disclosed cathodes have the unique feature that they are formed from comparatively long sections of small diameter stainless steel hypodermic tubing that have been further sharpened by ion beam sputtering. [The reason for this construction is that within the vacuum system of an implanter there is always fluorine present that arises from the use of $BF_3$ gas in the ion source needed for the production of boron beams and of $BF_2$ ions. The effect is that corrosion will rapidly damage the sharp tips needed to produce field emission at low voltages (~10 volts)]. A small flow of argon or other suitable gas protects the emitter from the corroding effects of fluorides. The use of a long tube rather than a solid cathode allows a calculable high-flow impedance to be introduced to the gas flow line.

A second method for providing low-energy secondary electrons emitted from surfaces close to the pole face of the deflecting magnet uses heated filaments of tungsten and molybdenum wire for the emission of electrons. Such filaments are located in substantially field-free regions producing electrons that travel only a short distance before impinging upon a secondary emission cathode manufactured from graphite or other suitable material. The geometry should be such that the generated secondary electrons should link readily to the deflecting magnetic field lines.

Also presented are methods using an external high energy beam of an ion species such as argon or xenon for the production of low-energy electrons from interaction with atoms and molecules of the residual vacuum.

BRIEF DESCRIPTION OF THE DRAWINGS

For better understanding of the present invention, reference is made to the accompanying drawings which are incorporated herein by reference.

DETAILED DESCRIPTION

Figure 1:
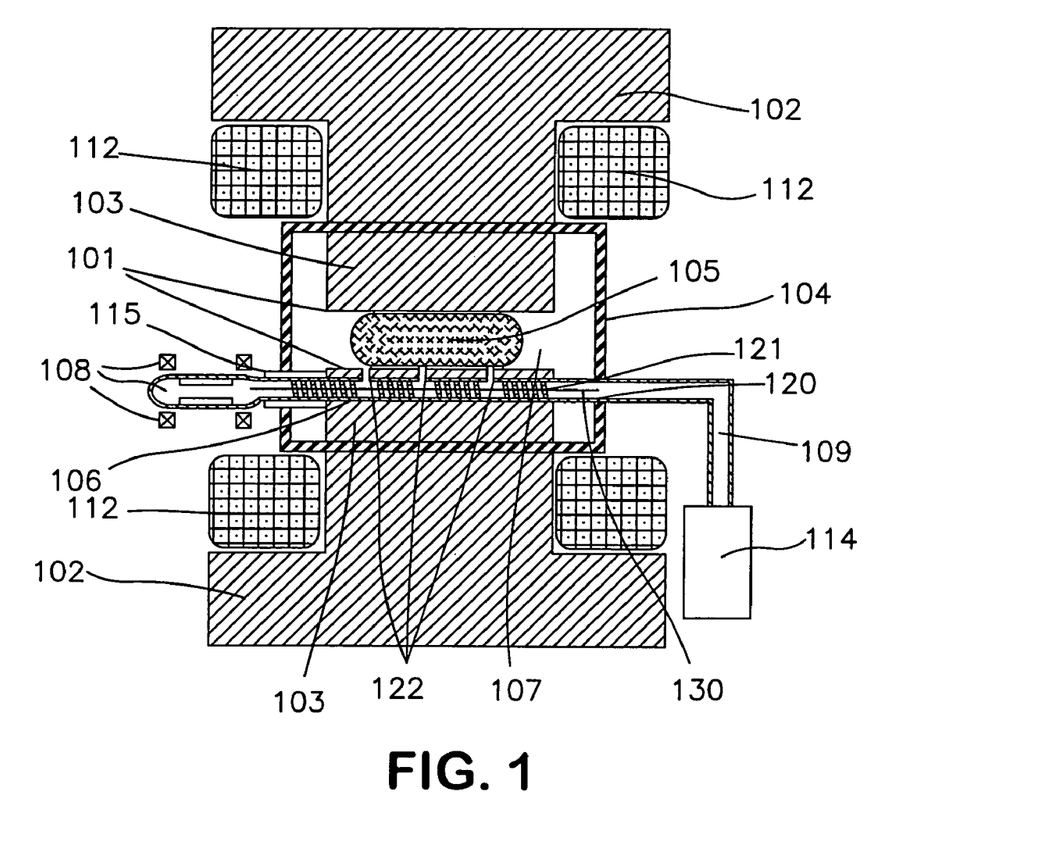
FIG. 1 illustrates A Plasma Transport Channel Within Dipole Magnet.

FIG. 1 illustrates a cross section of the magnetic pole of a deflection magnet. Although those skilled in the art will recognize that the pole surface, 101, may actually be part of the underlying magnetic return yoke, 102, in the preferred embodiment the surfaces of the poles, 103, are located within the vacuum chamber, 104, rather than outside it. The magnetic field is produced by the coils, 112. This allows the magnetic poles to be as close as needed to the trajectories of the ion beam, 105, without wasting distance for a wide vacuum envelope that needs thick walls to withstand atmospheric forces. Actively variable fields may be introduced using surface windings that are detailed in a companion patent application entitled "Broad Energy Range Ribbon Ion Beam Collimation Using a variable Gradient Dipole" by Kenneth H. Purser and Norman L. Turner.

It can be seen that a modest diameter hole, 106, is drilled through the width of the pole plate, 103, defining a tunnel. While the poles, 103, provide magnetic flux to the deflection gap, 107, most of the flux within the steel will not penetrate through the space, or tunnel, defined by the hole, 106. As mentioned earlier, the magnetostatic driving potential, $\underline{H}$, is almost zero within the steel. Thus, at low flux levels steels high magnetic permeability causes the hole to represent a major reluctance to magnetic field. In the preferred embodiment, the hole, 106, is far from the surface, 101, to ensure that the wanted shape of the dipole deflection field is not affected.

A suitable generator, 108, injects argon plasma or other plasma through the steel shield, 115, into the end of the tunnel, 106. After traveling the length of the tunnel, residual gas is pumped away at the distant end, 109, by the pump, 114. Auxiliary cathodes, 126, can be introduced to augment the electron current flow to the ion beam, 105. In the preferred embodiment a neutral particle skimmer, to be described later, is introduced between the source, 108 and the steel clamp, 115.

To drift the plasma and avoid excessive recombination at the walls a stainless steel tube, 120, is slipped into the hole, 106. Those skilled in the art will recognize that other tube materials, such as quartz, glass or other electrical conducting materials may also be satisfactory. A low-value solenoidal magnetic field is maintained along the length of the tube, 120, by passing current along a close-pitched spiral, 121, located within or around the outside of the tube, 120. A small diameter wire may also be located along the center-line of the tube, 120. A positive potential on this wire establishes an electric field that is always radial so that when coupled with the solenoidal magnetic field generated by the spiral, 121, a circulating E×B drift is created that minimizes ion-electron recombination at the walls. At the locations where plasma must be released to the surface of the magnetic pole, the solenoidal field is modified allowing the plasma to expand and pass though a suitable magnetic plasma channel, 122, or slot having a suitably-sized shape for passing plasma to the surface of the pole, 101. A magnetic coupling field, generated by small coils or permanent magnets can be used to provide the necessary B-field lines along which plasma will travel.

Figure 2:
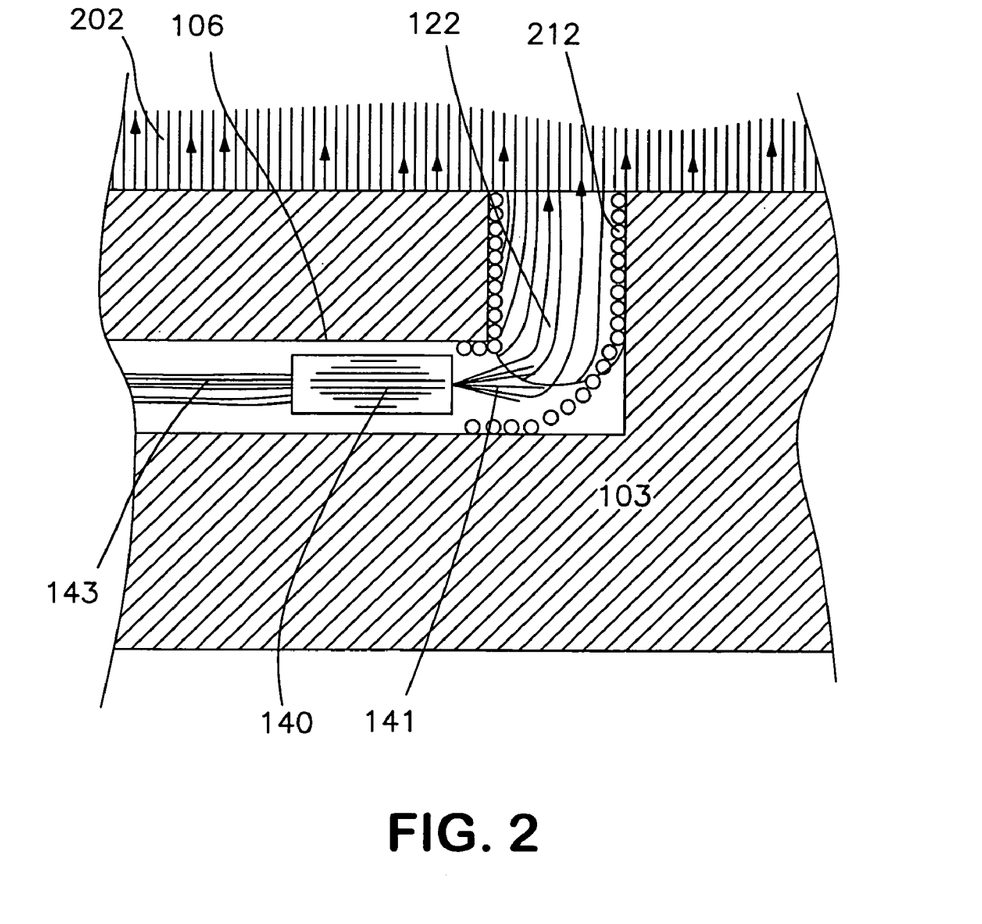
FIG. 2 illustrates Hollow Cathode Plasma Injection.

FIG. 2 illustrates a method for coupling a hollow-cathode plasma source, 140, into a field-free region beneath the magnet pole. Plasma gas, typically argon, krypton or xenon, is introduced to a hollow cathode source through the hollow tube, 143. An intense plasma, 141, is emitted through a tiny aperture in the end of the source together with a substantial number of electrons. A solenoidal winding, 212, between the region of the deflecting dipole field and region of the plasma, 141, assists with coupling the plasma to the deflecting magnetic field, 202, in the region, 122.

Figure 3:
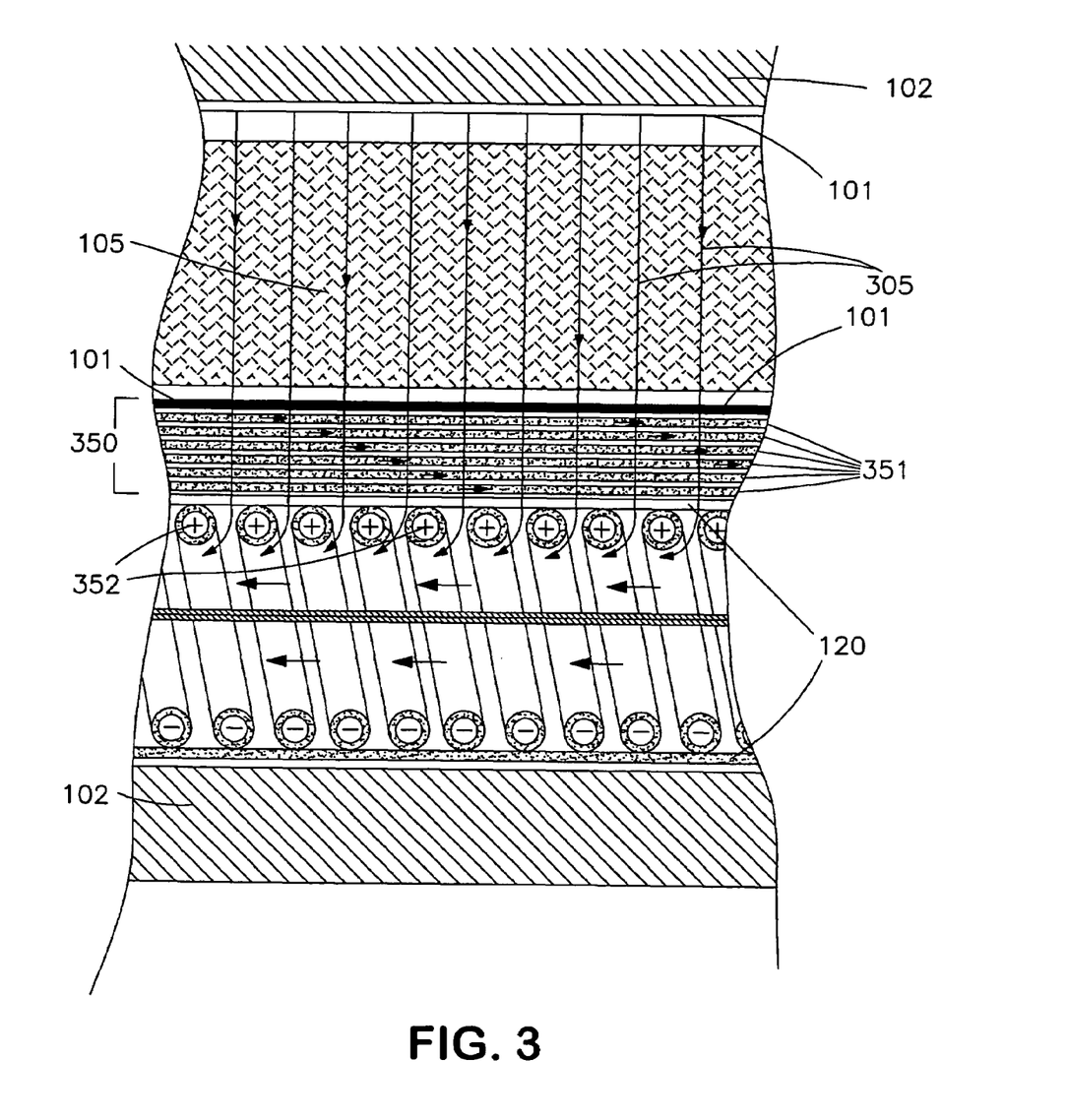
FIG. 3 illustrates Details of Plasma Delivery for Slot Beams.

FIG. 3 illustrates the details of how plasma can be linked to the dopant ion beam, 105, when the connection region between the plasma delivery tube and the dipole magnetic field region is a narrow elongated slot, 350, rather than the discrete holes shown in FIGS. 1 and 2. The importance of a slot for proper ribbon-beam operation is that uniformity at the wafer of the ribbon ion beam is critical and localized introduction of neutralizing electrons, as shown in FIG. 2, may cause non-uniformities in the ribbon-beam ions when they arrive at the wafer.

Referring again to FIG. 3 it can be seen that the magnet poles are shown as item 101. The return yoke steel is 102. The tube through which the plasma passes is item 120. Rather than using discrete solenoidal fields for coupling plasma passing through the tube 120, in the manner described earlier, a rectangular solenoidal field, generated by the windings, 351, located along the length and sides of a narrow coupling slot, 350, provides the necessary coupling field. Current through individual solenoidal coils, 352, not only provides the containment field along the tube, 120, but also provides a field distribution near individual coils that deflects a component of the dipole field to join with the solenoidal field in the tube, 120.

Following drift of plasma into the dipole-field deflection region, 107, plasma electrons are constrained by the dipole magnetic field and drift away from the pole along the B-field lines, 305. Until linking to the positive ion-beam potential well is effected, the positive ions within the plasma tend to move with the electrons. However, on reaching the ion beam boundary, plasma electrons transfer to the ion beam potential well and are trapped along magnetic field lines passing through the ion beam, becoming thermalized in one dimension along the field lines. The residual slow positively charged plasma particles are repulsed by the beam potential and tend to accelerate towards the magnetic poles, 101. Here, secondary electrons are produced that in turn are attracted back towards the ion beam, 105. Ideally, the original space-charge neutral plasma now provides a conductor between the auxiliary cathode and the charged particle beam, 105. This feature emphasizes the importance of using an intense plasma source, such as a Helicon.

Figure 4:
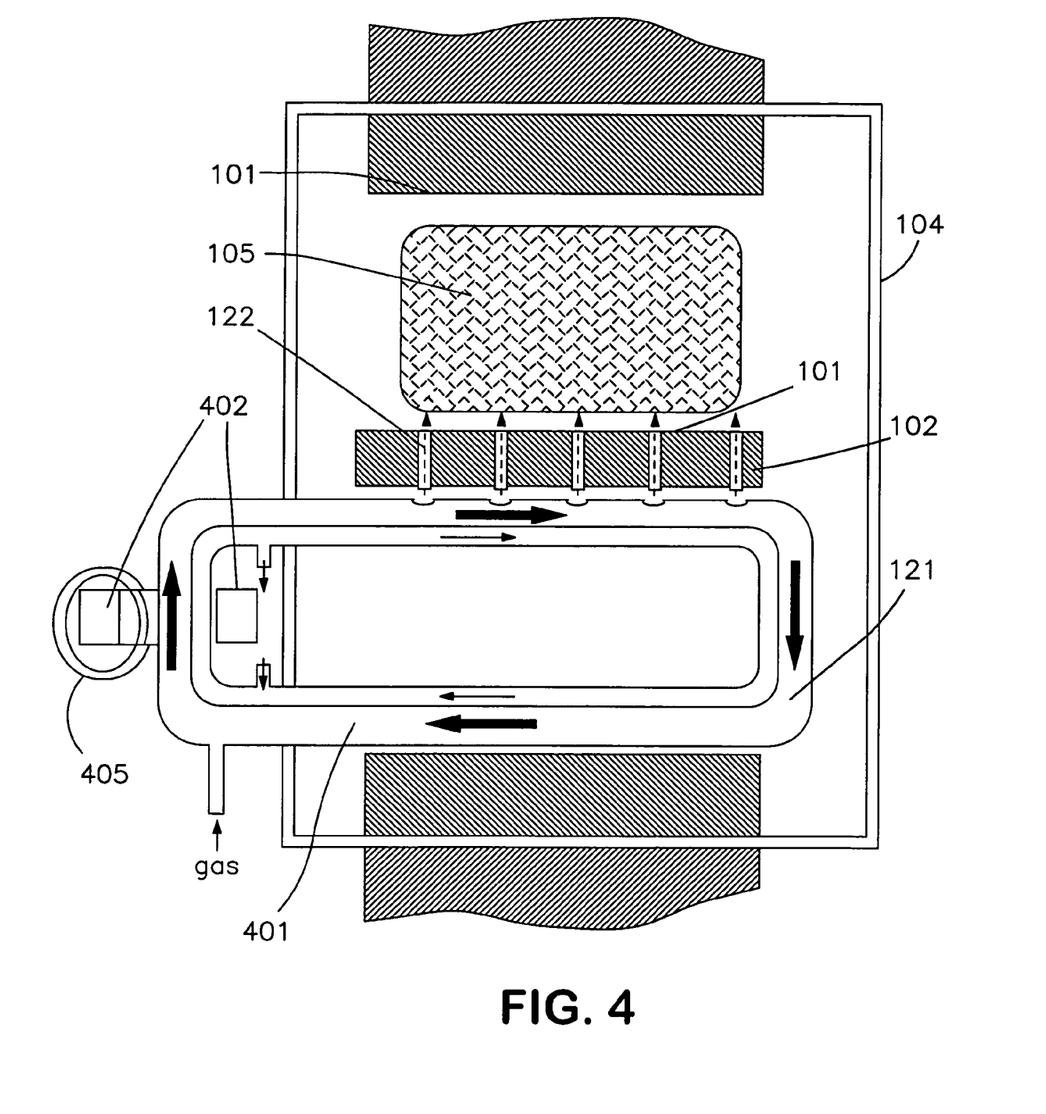
FIG. 4 illustrates A Radial Plasma Generator.

FIG. 4 illustrates a second embodiment concerning details of a method for plasma generation. A pair of radial tubes, 401, connected together as a continuous circuit and located within a field-free slot wide enough to keep residual capacitance small. Plasma is produced constantly along the length of the continuous tubes, 401, by currents circulating around the loop energized by a torroidal ferrite coupler, 402. The driver, 405, causes electric currents to flow around the periphery of the discharge circuit, 401, creating plasma around the whole loop. Holes or a slot ground along the tubes, 401, allow plasma to be extracted.

Figure 5:
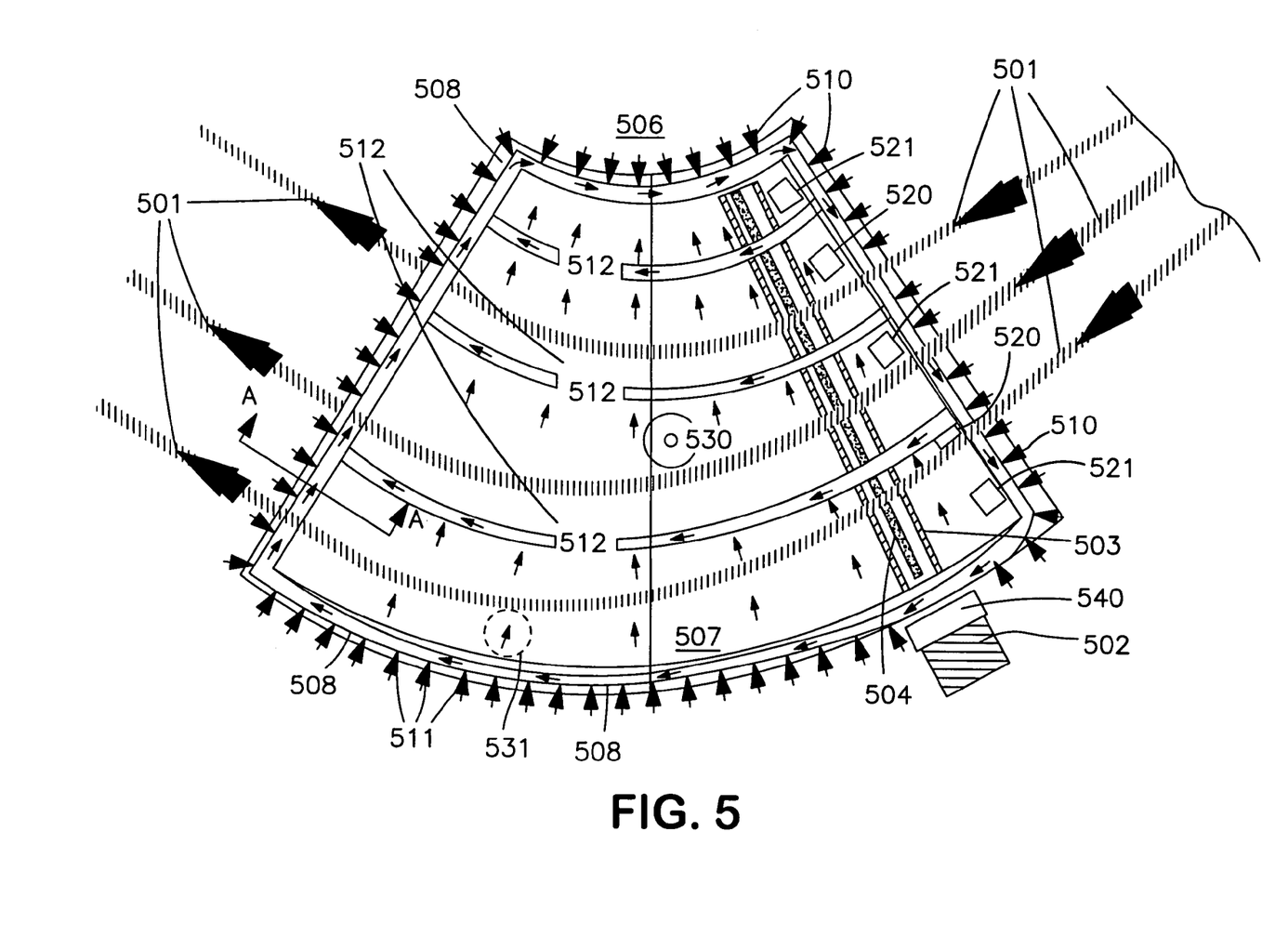
FIG. 5 illustrates Electron Drifting Around a Deflection Magnet.

FIG. 5 illustrates the lower pole of an apparatus that deflects a ribbon ion beam, 501, depicted only by the central trajectory and the extreme rays. The magnetic deflecting field comes out of the page in the direction shown by the symbol 530. To provide beam neutralization and avoid excessive space-charge expansion, electrons are distributed within the magnetic deflection region through which the ribbon beam, 501, passes. Although limitations are not intended, the preferred embodiment for the magnetic field is a positively-indexed field distribution, needed for ion focusing, that decreases in intensity from the smaller radius region, 506, to the weaker-field larger radius region, 507. The small arrows, 531, show the gradient of the deflecting dipole field. A substantial chamfer, 508, surrounds the magnetic pole producing a field gradient, 510, illustrated by the direction of the arrow heads, 511. The width of the chamfer, 508, should be sufficiently wide that it is comparable to the dipole magnetic gap, although those skilled in the art will recognize that a width of 25 mm will usually be sufficient. If necessary, the magnetic field boundary region at the entrance to the pole may be angled to provide a positive shim-angle, with respect to the central beam direction, to enhance electron introduction from the chamfered edge region into the main deflection region.

The source of electrons needed for beam neutralization can be produced by interactions between the beam ions themselves and residual gas atoms or molecules present in the vacuum system. Those skilled in the art will recognize that ionization type electron production cross-sections reduce substantially at low energies. However, when processes that include molecular-excitation interactions and the use of good electron confinement are included, sufficient electron densities can be produced that allow boron ions having energies as low as 1-2 keV to be transported without the need for adding additional electrons.

An important issue is conservation of those electrons that are produced or captured by the beam envelope. Referring again to FIG. 5, it will be seen that B×grad B forces, cause electrons in the magnetic field region to travel across the tapered pole face, because of the focusing field-gradient. The B×grad B drift vector acts across the whole face, but for simplicity of the figure, only three sections are shown as items 512. When the electrons reach the far side of the pole they encounter an almost 90-degree shift in the field-gradient direction that causes the drifting electrons to change direction and travel around the periphery of the pole in the region, 508, in the direction shown by the white arrows, 532. A small shim angle at the beam entrance to the pole can be introduced to cause the electrons to be re-injected to the main deflection region. It also may be necessary to encourage electron return to the main field region using electrically conducting elements, 520, 521. These elements have appropriate electrical potentials (positive and negative) to establish an electric field substantially at right angles to the deflecting magnetic field, 503, causing E×B drift that moves electrons across the field lines and into the indexed gradient region. Those skilled in the art will recognize that to avoid disturbance to low-energy ion beams, 501, the voltage gradients should be small and that this limitation may be as small as 0.1 Volts/mm. Such fields across the plasma can be supported because of the presence of the dipole deflection field.

Referring again to FIG. 5 it will be noticed that a plasma introduction tunnel, 503, passes through the body of the pole-steel. This tunnel is submerged at a suitable depth beneath the dipole surface to ensure that the main dipole field is not affected by its presence. In the preferred embodiment a slot, 350, is milled through the pole along the length of the tube, 503, to allow connection of the tube to the pole-surface in the magnet-dipole field region. As described previously, rectangular dipole field generating coils are included within the walls of the slot, either by the use of active currents or by permanent magnets, to produce a connecting field between tube plasma and the region of the main dipole field, 530.

The plasma needed for neutralization is generated externally from whence it is directed into the tube, 503. It should be noted that the generator, item 502, can consist of any suitable plasma source although in the preferred embodiment the source described is a high plasma-density Helicon device. In addition, in FIG. 9, it will be described the manner in which a cryogenic pumping arrangement, 902, can be included for the removal of much of the neutral gas produced in conjunction with the wanted plasma.

Figure 6:
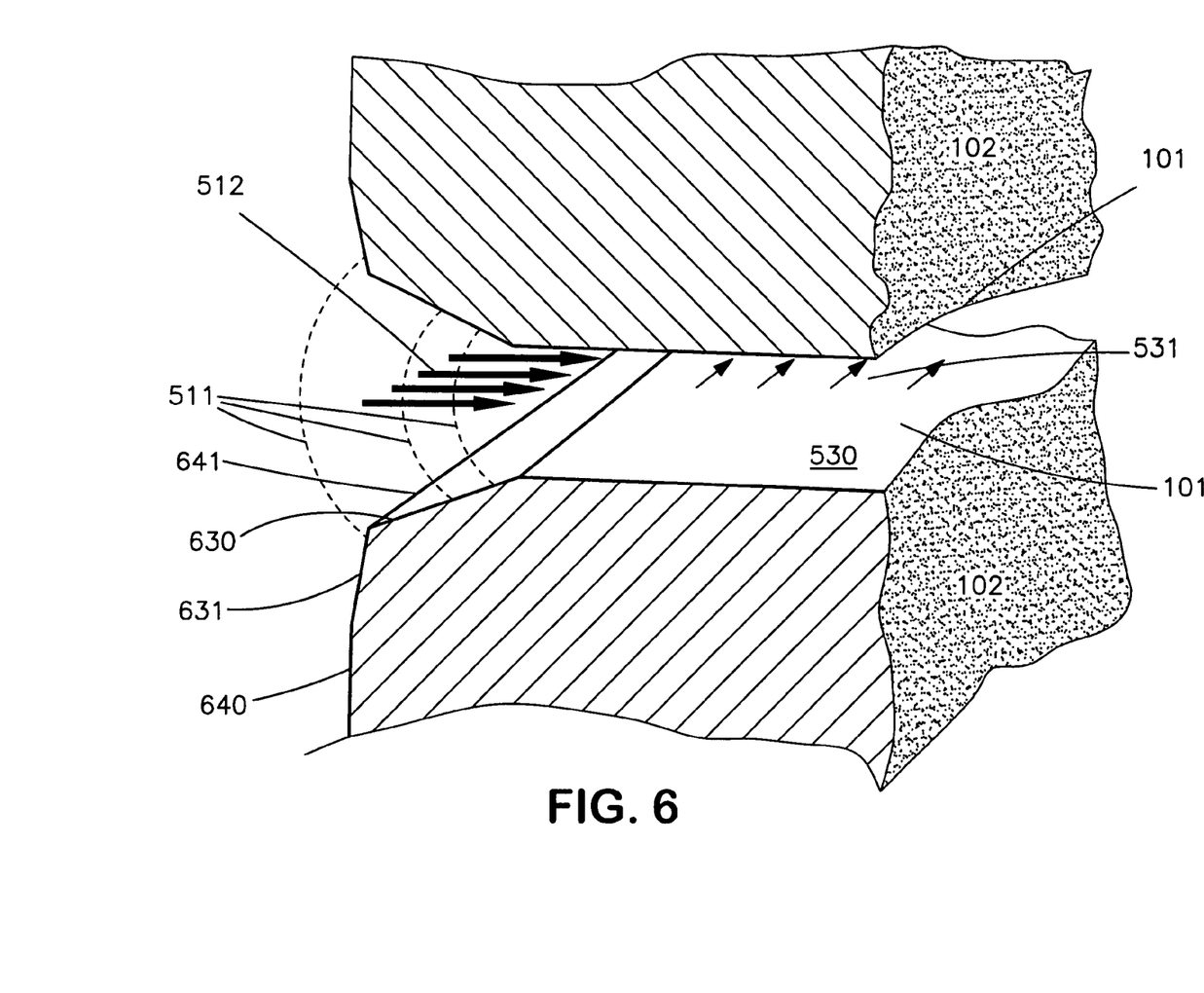
FIG. 6 illustrates Chamfer Edge Geometry.

FIG. 6 shows details of the cross section, A-A' shown in FIG. 5. The upper and lower poles, 101, of the deflecting magnet are shown together. Two chamfer cuts are made around the whole perimeter of the deflection pole. The purpose of these chamfers is to produce a strong radial gradient towards the main deflection region, 530. Equipotentials, 511, are sketched showing that in the region well away from the junction between the chamfer plane and the pole surface the chamfer field gradient vectors are substantially at right angles to the edge, 641; thus, electrons will tend to travel along paths approximately parallel to the edge, 641. Those skilled in the art will recognize that a simple pair of cuts, 630, 631, made as shown, will terminate the field without significant local saturation and provide a suitable chamfer. They will also recognize that, at beam entry and exit regions, by using appropriate angles and lengths the sharp cut-off boundary will coincide with the vertical section, 640.

Figure 7:
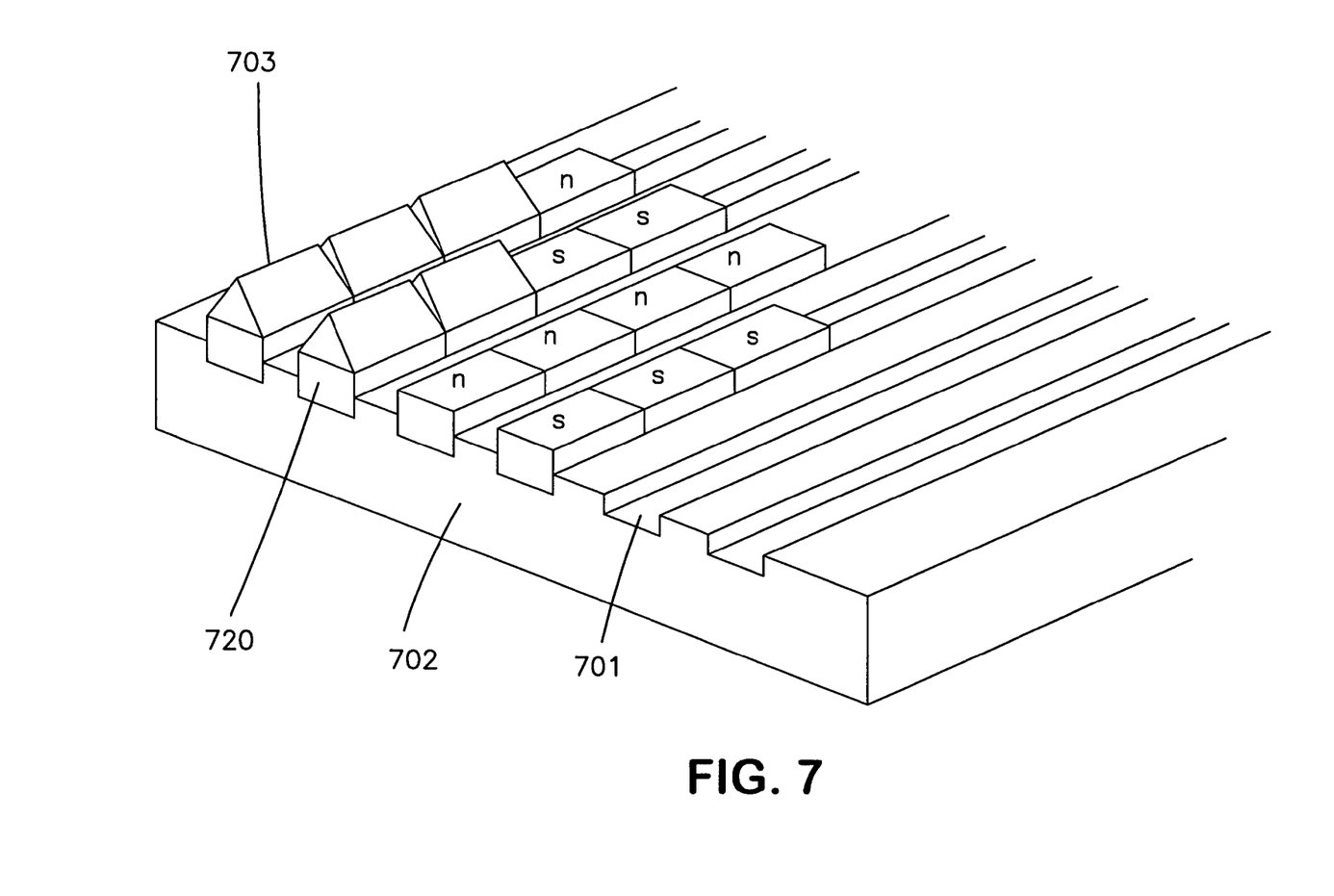
FIG. 7 illustrates Introduction of Cusp Fields.

FIG. 7 illustrates in more detail the manner in which small permanent magnets, 720, are mounted on the dipole surfaces and in the chamfer regions, 508, to produce cusp fields that reduce electron losses. The design constraints are (1) High fields at the surface of the cusp magnets are essential for improving electron reflection capability; (2) Close spacing prevents the cusp fields reaching into the beam-deflection region and upsetting the dipole-field focusing optics. In the preferred embodiment, slots, 701, slightly wider than the width of small high-field neodymium-iron-boron magnets, 720, are milled into the surface of a steel sheet, 702, with a spacing between rows of a few millimeters. Locating the magnets on a steel base enhances the intensity of the cusp magnetic fields and hence improves electron trapping. The depth of the slots are only enough to secure the magnets during assembly. The magnets, 720, are arranged as shown with rows of north poles next to rows of south poles. The effect is that individual dipoles fields produced between adjacent rows only reach a short distance into the region of beam motion, minimizing the magnetic interaction of the cusp fields with the ribbon beam, itself.

It can be seen that in the preferred embodiment a small roof-shaped solid steel extension, 703, is attached to the surface of each permanent magnet to increase the local flux density at the tip and improve electron trapping.

Figure 8:
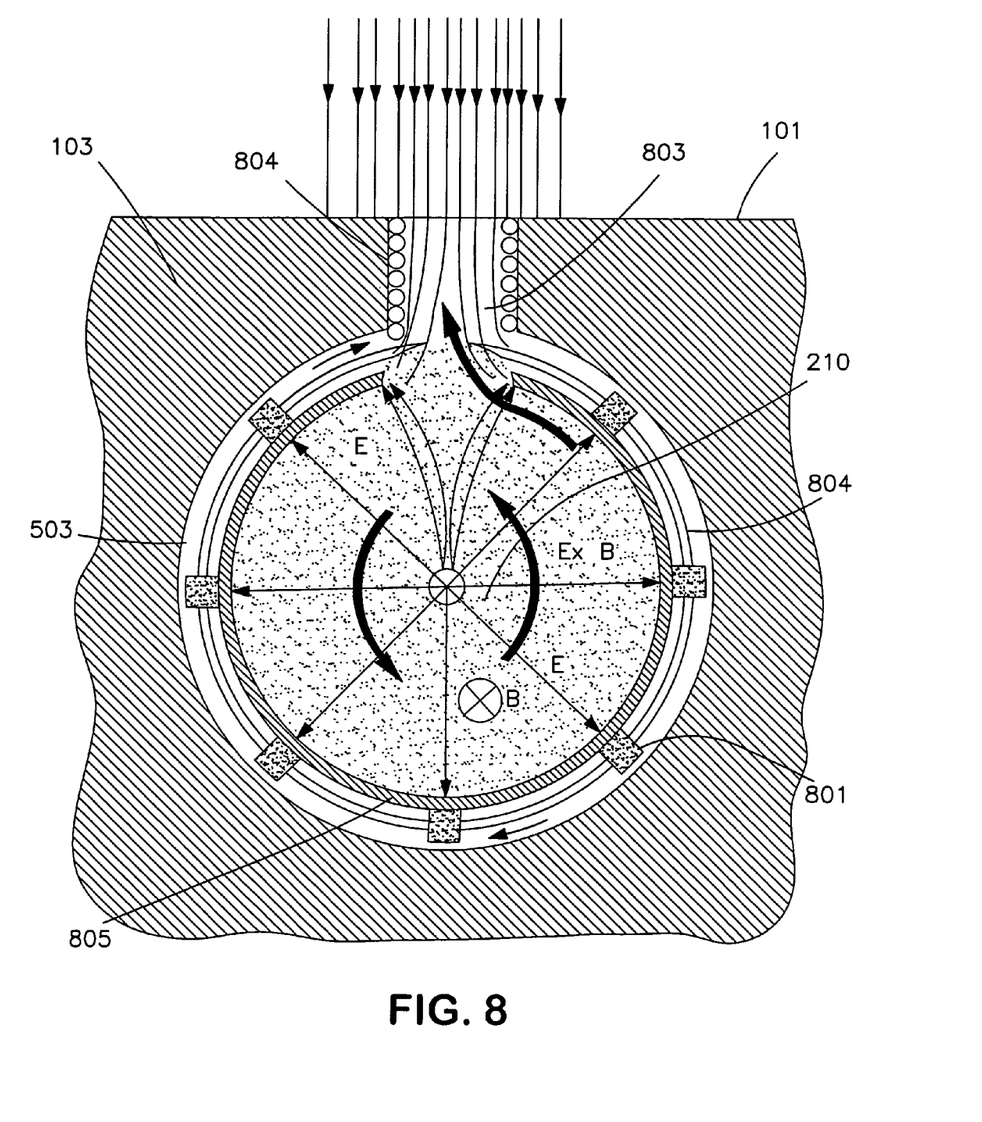
FIG. 8 illustrates A Section across Plasma Delivery Tube.

FIG. 8 shows a cross section perpendicular to the tube, 503, shown in FIG. 5. A conductive cylinder, 805, is supported away from the steel of the poles, 101, by small fish-beads, 801, that provide spacing for wire between the walls of the tunnel, 503, and the conductive cylinder, 805. The wire, 804, passes current that generates a solenoidal field along the axis of the tube. The fish-bead insulation allows voltage to be applied between the central wire, 210, needed for generating the E-field used for E×B motion.

Current passing through a group of conductors, 804, fastened to the walls of the slot, 803, produce a connecting magnetic field that allows plasma to be extracted from the delivery tube.

Figure 9:
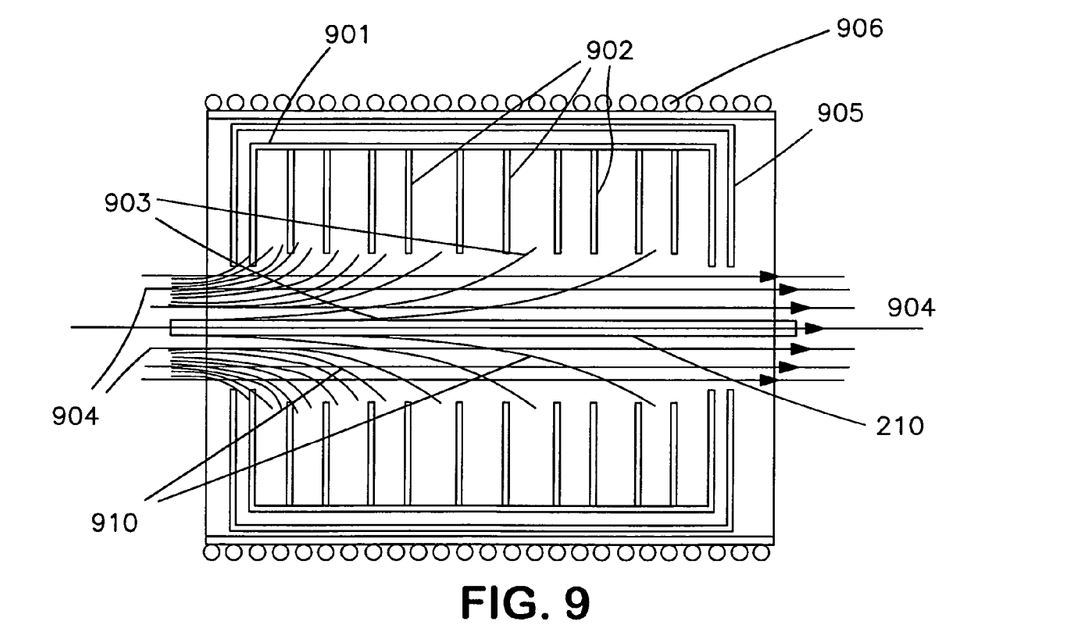
FIG. 9 illustrates Cryogenic Gas Skimmer

FIG. 9 shows details of an auxiliary cryogenic pumping unit that may be desirable for handling the additional gas loads from the plasma generator(s). A commercial cryogenic refrigerator provides a few Watts of cooling to the collector structure, 902, maintaining it at a temperature below 20 K. A radiation shield, 905, surrounds the unit to minimize heat loading. To extract this heat, a further 50 Watts of cooling is available at approximately 70 K which can be used for extracting heat from the radiation shields, 905 that surround the cryogenic collector. 902. The collector plates can be coated with a suitable material, such as coconut derived charcoal, for additional pumping of hydrogen, if this is necessary.

Neutral gas molecules, 903, leaving the source are not constrained by the longitudinal fields generated by the solenoidal winding, 906 and, thus, they preferentially collect on the low-temperature collectors, 902. In contrast, plasma from the source, 904, is constrained by the magnetic field generated by the coils, 906, passing largely undeflected through the unit.

Figure 10:
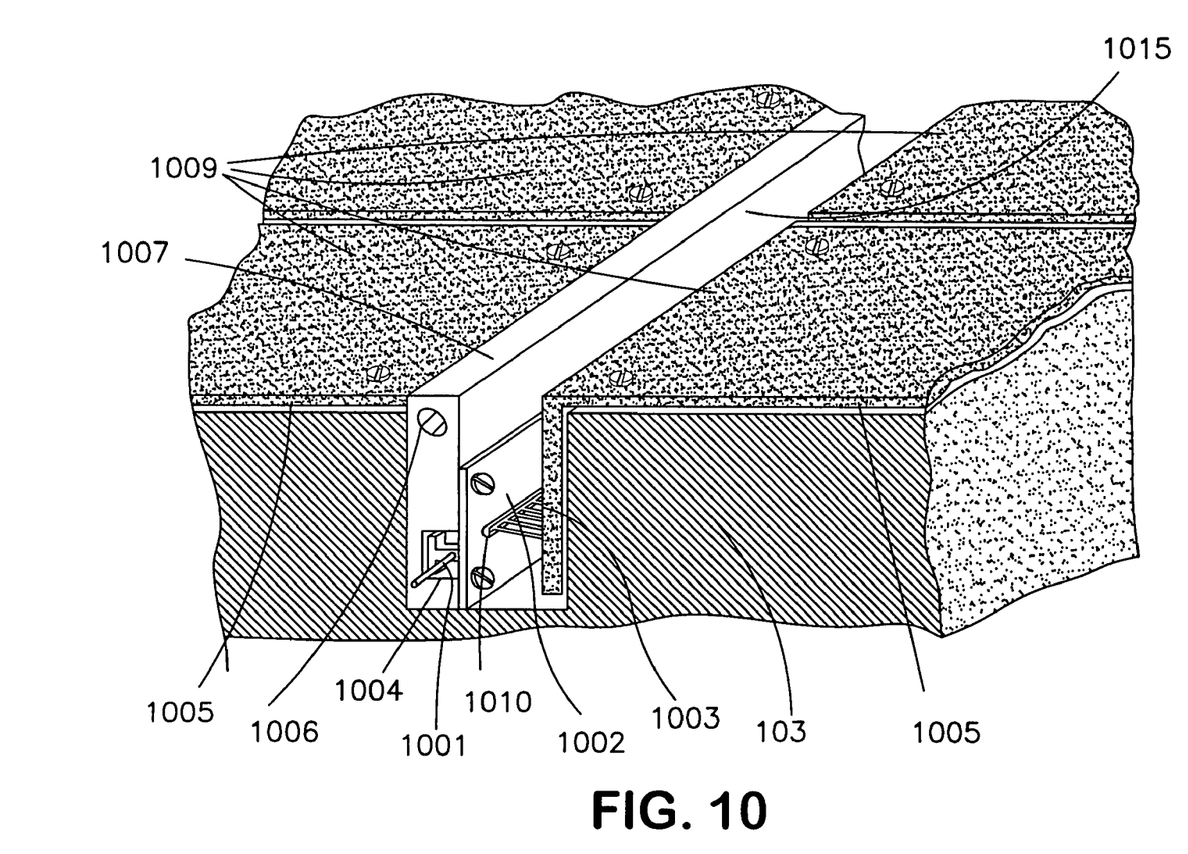
FIG. 10 illustrates an In-Pole Secondary Electron Source

FIG. 10 shows the preferred embodiment for the generation of secondary electrons in a low magnetic field region close to the surface of the pole, 103. It can be seen that a filament, 1001, produces electrons with an energy of several hundreds volts. The high energy electrons, 1010, emitted through the acceleration plate, 1002, strike the graphite collector, 1003, producing low-energy secondary electrons which drift through the channel, 1015, where they link with the deflecting magnetic fields. It can be seen that graphite plates, 1005, cover the poles to minimize beam interactions.

What we claim is:

1. A method for adding electrons to neutralize space charge in a beam of ions being deflected by a magnetic field comprising the following steps:
   introducing plasma to region of said magnetic field from a plurality of plasma emitting regions located on the surface of magnetic poles that defines the boundaries of said magnetic field; and
   arranging said emitted plasma to be linked to said beam of ions at a plurality of positions along the path of said beam.

2. The method of claim 1 where said emitted plasma is produced by a remote generator.

3. The method of claim 2 where said remote generator is connected to the surface of said magnetic poles through channels that are substantially free of magnetic fields.

4. The method of claim 2 where said remote generator is connected to the surface of said magnetic poles through channels that are substantially free of transverse magnetic fields.

5. The method of claim 1 further comprising the step of introducing electrons into said emitted plasma.

6. The method of claim 1 further comprising the step of introducing charge-neutral atoms or molecules into said beam path.

7. The method of claim 1 further comprising the step of introducing charge-neutral atoms or molecules into said beam path as part of said introduced plasma.

8. The method of claim 1 further comprising the step of introducing atoms or molecules having positive electron affinity into said beam path.

9. The method of claim 1 further comprising the step of adding suitable electric fields within said magnetic field, which cause the electrons present within said beam of ions to move across magnetic field lines.

10. The method of claim 1 further comprising the step of adding a barrier to prevent the loss of trapped electrons.

11. The method of claim 10 further comprising embedding permanent magnet elements within at least one of said magnetic poles to induce field concentrations near the surface of said at least one magnetic poles.

12. The method of claim 10 wherein said barrier is an electrostatic barrier.

13. Apparatus for adding electrons to neutralize space charge in an ion beam traveling through a magnetic field comprising the following components:

a D.C. magnetic field that deflects said ion beam, said magnetic field being produced between a north magnetic pole and a south magnetic pole symmetrically disposed about a median plane; and a plurality of plasma emitters located at the surfaces of at least one of said magnetic poles that emit plasma along the flight path of said ion beam.

14. The apparatus of claim 13 wherein said plurality of plasma emitters is located on exactly one of said magnetic poles.

15. The apparatus of claim 13 wherein said flight path comprises the area of said ion beam projected onto said north and south magnetic poles.

16. The apparatus of claim 13 wherein a region substantially free of magnetic fields transfers said plasma to said plasma emitters located at said surfaces of said magnetic poles.

17. The apparatus of claim 16 wherein said substantially field-free region is a cylindrical hole.

18. The apparatus of claim 17 further comprising a current-carrying wire spiral.

19. The apparatus of claim 18 further comprising a uniform diameter wire located substantially along the central axis of said cylindrical hole.

20. The apparatus of claim 19 wherein said wire in insulated and a voltage is applied to said wire.

21. The apparatus of claim 18 wherein said wire spiral comprises a uniform-pitch current-carrying spiral.

22. The apparatus of claim 18 wherein said wire spiral comprises a non-uniform-pitch current-carrying spiral.

23. The apparatus of claim 13 further comprising electric fields substantially at right angles to the magnetic field present between said magnetic poles.

24. The apparatus of claim 13 further comprising a barrier to prevent the loss of trapped electrons.

25. The apparatus of claim 24 further comprising permanent magnetic elements embedded within at least one of said magnetic poles to induce field concentrations near the surface of said at least one magnetic poles.

26. The apparatus of claim 24 wherein said barrier comprises an electrostatic barrier.

27. A method for adding electrons to neutralize space charge in a beam of ions being deflected by a magnetic field comprising the following steps:

generating secondary electrons outside the boundaries of said magnetic field;

introducing secondary electrons to regions of said magnetic field from a plurality of secondary electron emitting regions located on the surface of the magnetic poles that defines the boundaries of said magnetic field; and arranging said emitted secondary electrons to be linked to said beam of ions at a plurality of positions along the path of said beam.

28. Apparatus for adding electrons to neutralize space charge in an ion beam traveling through a magnetic field comprising the following components:

a D.C. magnetic field that deflects said ion beam, said magnetic field being produced between a north magnetic pole and a south magnetic pole symmetrically disposed about a median plane;

a secondary electron generator located outside of said magnetic field; and a plurality of secondary electron emitters located at the surfaces of at least one of said magnetic poles that emit secondary electrons along the flight path of said ion beam.

29. The apparatus of claim 28 wherein said plurality of secondary electron emitters is located on exactly one of said magnetic poles.

30. The apparatus of claim 28 wherein said flight path comprises the area of said ion beam projected onto said north and south magnetic poles.

31. The apparatus of claim 28 wherein a region substantially free of magnetic fields transfers electrons from said electron generator to said secondary electron emitters located at said surfaces of said magnetic poles.

32. The apparatus of claim 31 wherein said substantially field-free region is a cylindrical hole.

33. The apparatus of claim 31 further comprising a current-carrying wire spiral.

34. The apparatus of claim 33 further comprising a uniform diameter wire located substantially along the central axis of said cylindrical hole.

35. The apparatus of claim 34 wherein said wire is insulated and a voltage is applied to said wire.

36. The apparatus of claim 33 wherein said wire spiral comprises a uniform-pitch current-carrying spiral.

37. The apparatus of claim 33 wherein said wire spiral comprises a non-uniform-pitch current-carrying spiral.

38. The apparatus of claim 28 further comprising electric fields substantially at right angles to the magnetic field present between said magnetic poles.

39. The apparatus of claim 28 further comprising a barrier to prevent the loss of trapped electrons.

40. The apparatus of claim 39 further comprising permanent magnetic elements embedded within at least one of said magnetic poles to induce field concentrations near the surface of said at least one magnetic poles.

41. The apparatus of claim 39 further comprising dimpling of the magnetic pole face to introduce field concentrations near the surface of the magnetic poles.

42. The apparatus of claim 39 wherein said barrier comprises an electrostatic barrier.

* * * * *